United States Patent
Okuno et al.

[11] Patent Number: 6,110,842
[45] Date of Patent: Aug. 29, 2000

[54] METHOD OF FORMING MULTIPLE GATE OXIDE THICKNESSES USING HIGH DENSITY PLASMA NITRIDATION

[75] Inventors: Yasutoshi Okuno, Richardson; Sunil V. Hattangady, McKinney, both of Tex.

[73] Assignee: Texas Instruments Incorporated, Dallas, Tex.

[21] Appl. No.: 09/064,455

[22] Filed: Apr. 22, 1998

Related U.S. Application Data

[60] Provisional application No. 60/019,429, Jun. 7, 1996, provisional application No. 60/035,375, Dec. 5, 1996, and provisional application No. 60/045,109, Apr. 30, 1997.

[51] Int. Cl.[7] .................................................. H01L 21/469
[52] U.S. Cl. .......................... 438/776; 438/981; 438/776; 438/770; 438/786
[58] Field of Search ................................... 438/775–777, 438/981, 769, 791, 792, 786, 258, 266–267, 513; 257/638–640, 649

[56] References Cited

U.S. PATENT DOCUMENTS

| | | | |
|---|---|---|---|
| 4,764,248 | 8/1988 | Bhattacherjee et al. | 156/643 |
| 4,980,307 | 12/1990 | Ito et al. | 438/591 |
| 5,672,521 | 9/1997 | Barsan et al. | 438/276 |
| 5,763,922 | 6/1998 | Chau | 257/371 |
| 5,834,351 | 11/1998 | Chang et al. | 438/266 |
| 5,937,310 | 8/1999 | Gardner et al. | 438/440 |

OTHER PUBLICATIONS

Wolf "silicon processing for the VLSI Era" vol. 1, pp. 308–310, 1989.

October 1997, American Vacuum Society National Symposium, San Jose, CA, "Modeling of Ultrathin Oxynitride Gate Dielectrics Formed by Remote Plasma Nitridation of Silicon Dioxide" pp. 1–12 (Dixit Kapila and Sunil Hattangady).

IEEE Electron Device Letters, vol. 16, No. 7, Jul. 1995, "Simultaneous Growth of Different Thickness Gate Oxides in Silicon CMOS Processing", pp. 301–302 (Brian Doyle, Member, IEEE, Hamid R. Soleimani and Ara Philipossian).

*Primary Examiner*—Charles Bowers
*Assistant Examiner*—Thanh Nguyen
*Attorney, Agent, or Firm*—Jacqueline J. Garner; W. James Brady, III; Frederick J. Telecky, Jr.

[57] ABSTRACT

A method for forming integrated circuits having multiple gate oxide thicknesses. A high density plasma is used for selective plasma nitridation to reduce the effective gate dielectric thickness in selected areas only. In one embodiment, a pattern (12) is formed over a substrate (10) and a high density plasma nitridation is used to form a thin nitride or oxynitride layer (18) on the surface of the substrate (10). The pattern (12) is removed and oxidation takes place. The nitride (or oxynitride) layer (18) retards oxidation (20b), whereas, in the areas (20a) where the nitride (or oxynitride) layer (18) is not present, oxidation is not retarded. In another embodiment, a thermal oxide is grown. A pattern is then placed that exposes areas where a thinner effective gate oxide is desired. The high density plasma nitridation is performed converting a portion of the gate oxide to nitride or oxynitride. The effective thickness of the combined gate dielectric is reduced.

15 Claims, 3 Drawing Sheets

METHOD OF FORMING MULTIPLE GATE OXIDE THICKNESSES USING HIGH DENSITY PLASMA NITRIDATION

CROSS-REFERENCE TO RELATED APPLICATIONS

The following co-assigned patent applications are hereby incorporated herein by reference:

| Serial No. | Filing Date | TI-number | Inventor |
| --- | --- | --- | --- |
| 60/019,429 | 6/7/96 | TI-23502P | Hattangady et al. |
| 60/035,375 | 12/5/96 | TI-22980P | Kraft et al. |

This application claims priority under 35 USC §119(e)(1) of provisional application No. 60/045,109, filed Apr. 30, 1997.

FIELD OF THE INVENTION

This invention generally relates to semiconductor processing and more specifically to forming devices having multiple gate oxide thicknesses.

BACKGROUND OF THE INVENTION

Presently, there is a great demand for shrinking semiconductor devices to provide an increased density of devices on the semiconductor chip that are faster and consume less power. The scaling of devices in the lateral dimension requires vertical scaling as well so as to achieve adequate device performance. This vertical scaling requires the thickness of the gate dielectric to be reduced so as to provide the required device performance.

On the other hand, there are several instances on a semiconductor chip where thicker gate dielectrics are still desired. For example, if the operating voltage is decreased, the device may no longer be compatible with most of the current packaged integrated circuits which operate at a standard voltage. For, instance, most circuits using CMOS transistors with gate lengths of 0.5 microns or more operate at 3.3V. When the gate length is decreased to 0.35 microns, the gate oxide thickness is reduced as well and the operating voltage is lowered to 2.5V or lower in order to maintain reliability of the gate oxide. Thus, a device may be needed that has input/output peripheral sections that operate at 3.3 V so that the device may be used in systems using other chips operating at 3.3 V while allowing other internal portions of the device to operate at 2.5 V. Other situations desiring dual gate dielectric thicknesses include: DRAMs in which a different gate dielectric thickness is desired for the high performance periphery versus the low leakage/low off-current array transistors; and embedded DRAMs which desire different thicknesses for transistors of the logic portion than for the DRAM transistors.

The seemingly most straightforward method of forming dual gate dielectric thicknesses is to grow a first gate oxide, resist pattern the first gate oxide, remove the exposed portions of the first gate oxide, remove the resist pattern, and then grow a second gate oxide. However, placing a resist pattern over the gate oxide and subsequently removing it can result in defects and contamination in the gate oxide as well as using twice the thermal budget of a single-thickness process.

One method used to form dual gate oxide thicknesses in a single chip without resist patterning the gate oxide, uses selective implantation of nitrogen into the substrate prior to oxidation (see, Soleimani et al, U.S. Pat. No. 5,330,920, issued Jun. 19, 1994). Nitrogen is used to retard the oxidation. Therefore, a patterned implant is used to implant nitrogen in areas where the thinner gate oxide is desired. Areas for thicker gate oxide transistors are not implanted. The pattern is then removed along with any sacrificial oxide. Then, the structure is oxidized to form the gate oxide having dual thicknesses. There are two difficulties in using this approach. First, implantation causes damage to the structure being implanted. Second, the nitrogen profile is difficult to control.

Another approach uses NH3 or N2O or NO thermal nitridation to form a nitride layer (see, Nakata, U.S. Pat. No. 5,254,489, issued Oct. 19, 1993). The nitride layer acts as an oxidation barrier and also nitrides the gate oxide. However, this approach requires high temperatures (in excess of 1000° C. for NH3) and the difficulty in controlling the nitrogen profile remains.

Another approach uses two polysilicon layers (see, Tada, U.S. Pat. No. 5,497,021, issued Mar. 5, 1996). One polysilicon layer is placed over a first gate of one thickness. Next, a second gate oxide is grown and another polysilicon layer is deposited over the second gate oxide. This process however, adds too many additional process steps.

SUMMARY OF THE INVENTION

A method for forming integrated circuits having multiple gate oxide thicknesses is disclosed herein that overcomes the problems associated with the prior art described above. A high density plasma is used for selective nitridation. The selective nitridation reduces the effective gate oxide thickness. In one embodiment, a pattern is formed over a structure and a high density plasma nitridation is used to form a thin nitride layer on the surface of the substrate. The pattern is removed and oxidation is then performed. The nitride layer retards oxidation, whereas, in the areas where the nitride layer is not present, oxidation is not retarded. In another embodiment, a thermal oxide is grown. A pattern is then placed that exposes areas where a thinner effective gate oxide is desired. The high density N2 plasma nitridation is performed and the effective (electrical) thickness of the gate oxide is reduced.

An advantage of the invention is providing a method for forming multiple gate oxide thicknesses on the same wafer, using low temperature and low thermal budget processes.

Another advantage of the invention is providing a method of forming multiple gate oxide thicknesses with an accurate, abrupt, uniform nitrogen profile.

Another advantage of the invention is providing a method of forming multiple gate oxide thicknesses without any degradation to the gate oxide integrity.

Another advantage of the invention is providing a method of forming multiple gate oxide thicknesses that is compatible with photo-resist patterns.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The invention will now be described in conjunction with forming a dual thickness gate oxide. Dual thickness gate oxides are beneficial for several devices. For example, it is sometimes desired to have a thicker gate oxide for input/output transistors than for the higher performance internal logic circuitry. Other examples include DRAM peripheral circuitry vs DRAM array circuitry and logic circuitry versus embedded DRAM circuitry. In addition, dual oxide thicknesses may be used to balance PMOS and NMOS transistors. Normally, PMOS transistors are about 50% larger than their NMOS counterparts for the same drive current. A thinner gate oxide can instead be used for the PMOS, thus allowing the PMOS and NMOS to be similar in size while having equivalent performance. It will be apparent to those of ordinary skill in the art that the benefits of the invention may be applied to other dielectric layers as well, such as those used for capacitor dielectrics and those used to isolate conductive structures.

The invention uses a high density plasma nitridation to selectively reduce the effective thickness of the gate oxide. High density plasma nitridation may be performed at low temperatures (<500° C.) and can be used to form a suitable nitrogen profile with high accuracy. In addition, high density plasma nitridation does not degrade the gate oxide integrity. Thus, a high density plasma nitridation can be used to overcome the problems associated with the prior art.

Figure 1A:
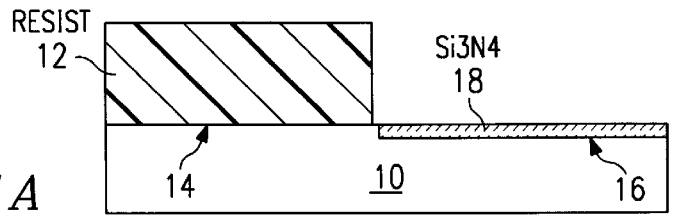
FIGS. 1A–C are cross-sectional diagrams of a gate dielectric according to a first embodiment of the invention at various stages of fabrication.

A first embodiment of the invention will now be described with reference to FIGS. 1A–1C. Referring to FIG. 1A, a mask 12 is formed on the surface of a substrate 10. Typically, a silicon substrate or silicon epitaxial layer is used for substrate 10. However, other substrates may alternatively be used. Substrate 10 will conventionally have already undergone several processing steps. For example, formation of isolation structures as well as various implants (e.g. threshold control implants) may have been performed.

Mask 12 is preferably a photoresist mask. Other masking materials may alternatively be used. Mask 12 masks or covers portions 14 of substrate 10 where a thicker gate oxide is desired and exposes portions 16 of substrate 10 where a thinner gate oxide is desired. For example, portions 14 may be the locations where NMOS transistors (vs. PMOS transistors) are desired or where peripheral circuitry (vs. DRAM array circuitry) is desired.

With mask 12 in place, a plasma nitridation is performed to form nitride or oxynitride layer 18. The source of nitrogen for the plasma may be a nitrogen containing precursor such as $N_2$ or $NH_3$ or their mixture with any other inert gas (He, Ar, etc.) or oxidizing gas (NO, $N_2O$, $O_2$, etc.). The plasma is preferably a high density plasma. The plasma may be generated by any one of a number of sources. For example, one of the following source may be used: helicon; helical-resonator; electron-cyclotron resonance; or inductively coupled. The substrate 10 can be unbiased, in which case the ionized substances are accelerated by the plasma potential (on the order of 20 Volts) and then implanted into the substrate 10 surface. A bias can be applied to the substrate 10 to further accelerate the ions from the plasma and implant them deeper into the surface. Either a DC or RF bias may be applied to the substrate 10. As an example, the following process conditions may be used: plasma density between $1 \times 10^{10}$ to $1 \times 10^{12}$ cm–3; nitrogen flow between 1–2000 sccm preferably 1–100 sccm); pressures on the order of 1–300 mTorr (preferably 1–50 mTorr), temperature in the range of 77 K to 773 K; substrate bias in the range of 0 to 200 Volts; and a duration in the range of 1 to 300 seconds.

Figure 1B:
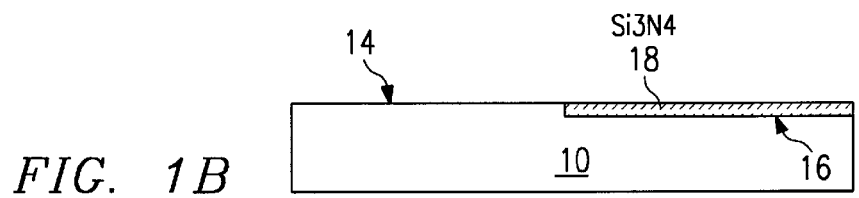
Figure 1C:
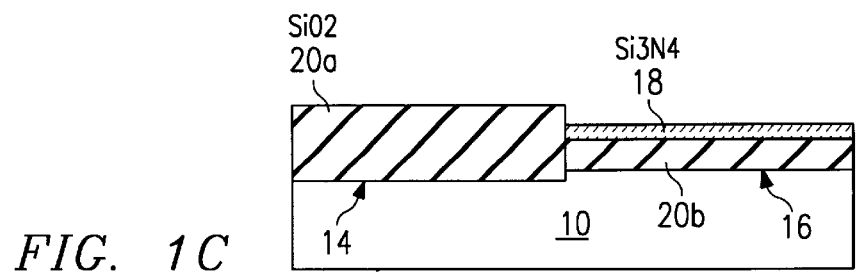

After the formation of nitride layer 18, mask layer 12 is removed as shown in FIG. 1B. The structure is then subjected to an oxidation step. Nitride layer 18 retards the oxidation. Therefore, a thinner oxide layer 20a is formed below nitride layer 18 and a thicker oxide layer 20b is formed where nitride layer 18 is not present. This is illustrated in FIG. 1C. Even including nitride layer 18, the effective thickness of the gate dielectric over portion 16 is less than that over portion 14. The difference in thickness between the two oxide portions 20a and 20b can be adjusted by choosing an appropriate nitridation condition (or nitride layer thickness) and an appropriate oxidation condition.

Figure 2A:
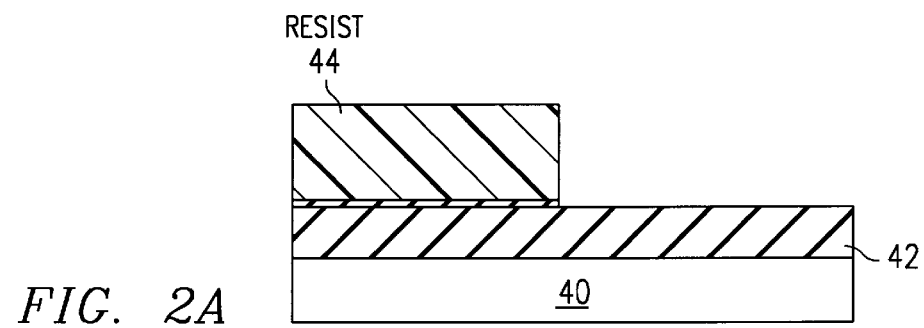
FIGS. 2A–B are cross-sectional diagrams of a gate dielectric according to a second embodiment of the invention at various stages of fabrication.
Figure 2B:
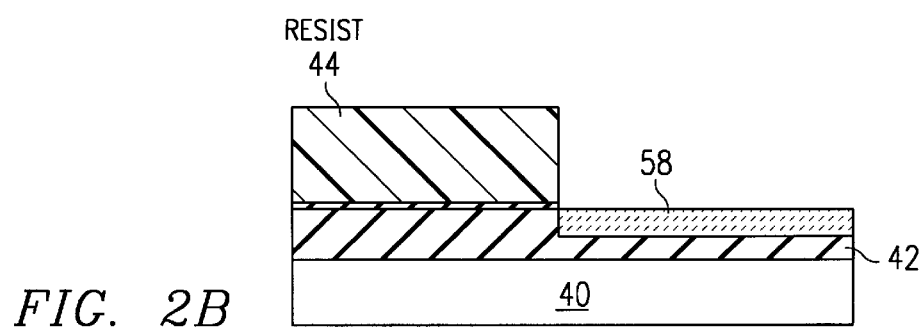

A second embodiment of the invention will now be described with reference to FIGS. 2A–2B. In this embodiment, the substrate 40 is processed through a traditional gate dielectric 42 formation. Gate dielectric 42 comprises an oxide, preferably silicon-dioxide. The thickness of gate dielectric 42 is determined by the desired thickness for the thicker gate dielectric devices (e.g., NMOS, peripheral, embedded DRAM, etc.). A typical gate dielectric thickness for a NMOS transistor at the 0.18 µm technology node may be on the order of 45 A.

A mask 44 is then formed on gate dielectric 42. Mask 44 is preferably a photoresist mask. Other masking materials may alternatively be used. Mask 44 masks or covers portions 54 of gate dielectric 42 where a thicker gate oxide is desired and exposed portions 56 of gate dielectric 42 where a thinner gate oxide is desired. For example, portions 54 may be the locations where NMOS transistors (vs. PMOS transistors) are desired or where peripheral circuitry (vs. DRAM array circuitry) is desired.

With mask 44 in place, a plasma nitridation is performed to form nitride (or oxynitride) layer 58. The source of nitrogen for the plasma may be a nitrogen containing gas. The plasma is preferably a high density plasma. The plasma may be generated by any one of a number of sources. For example, one of the following source may be used: helicon; helical-resonator; electron-cyclotron resonance; or inductively coupled. The substrate 40 can be unbiased, in which case the ionized substances are accelerated by the plasma potential (on the order of 20 Volts) and then implanted into the gate dielectric 42 surface. A bias can be applied to the substrate 40 to further accelerate the ions from the plasma and implant them deeper into the surface. Either a DC or RF bias may be applied to the substrate 40. As an example, the following process conditions may be used: plasma density between $1 \times 10^{10}$ to $1 \times 10^{12}$ cm–3; nitrogen flow between 1–2000 sccm (preferably 1–100 sccm); pressures on the order of 1–300 mTorr (preferrably 1–50 mTorr), temperature in the range of 77 K to 773 K (500° C.); substrate bias in the range of 0 to 50 Volts; and a duration in the range of 1 to 60 seconds. After plasma nitridation, mask 44 is removed, and processing continues with gate electrode formation.

Figure 3:
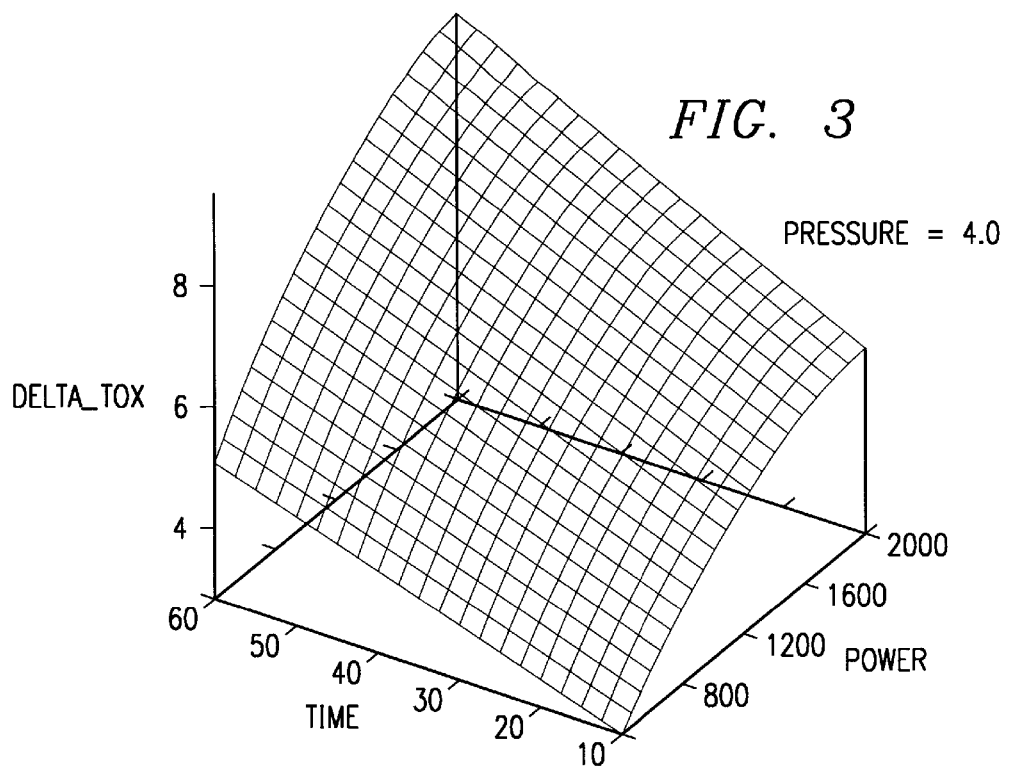
FIG. 3 is a three-dimensional graph of delta effective oxide thickness versus plasma power and plasma duration.

The plasma nitridation causes nitrogen to be incorporated into the exposed surface of the gate dielectric 42. This causes a surface of the exposed portion of the gate dielectric 42 to convert to a nitride layer (that is, a layer having more nitride than oxide). This effectively reduces the electrical thickness of gate dielectric 42 at this location. FIG. 3 is a graph of the effective oxide thickness as a function of nitridation processing parameters. A range of experiments were conducted on a PMT Pinnacle 8000 using a nitrogen gas flow of 100 sccm, a nitrogen pressure of 4 mTorr, a substrate distance from plasma source of 12.5 inches and a substrate supported with a ceramic ring. All wafers were subjected to a post-nitridation anneal in Ar at 900° C. for 20 minutes. The plasma power and plasma exposure time were varied. The delta change in effective gate oxide thickness (A) for the various plasma power (W) and duration (sec.) is plotted in FIG. 3. Plasma power was found to have the most significant effect on the amount of nitridation. As FIG. 3 shows, the decrease in effective gate oxide thickness occurs with higher plasma power and longer duration.

Figure 4:
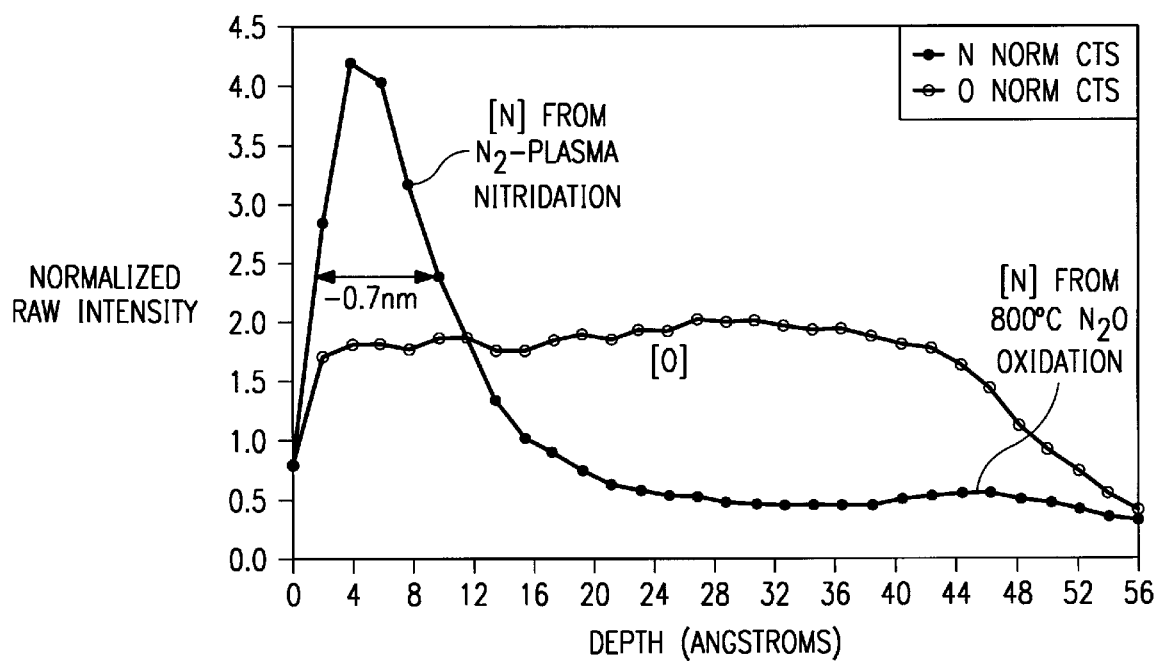
FIG. 4 is a graph of the [N] profile versus depth.
Figure 5:
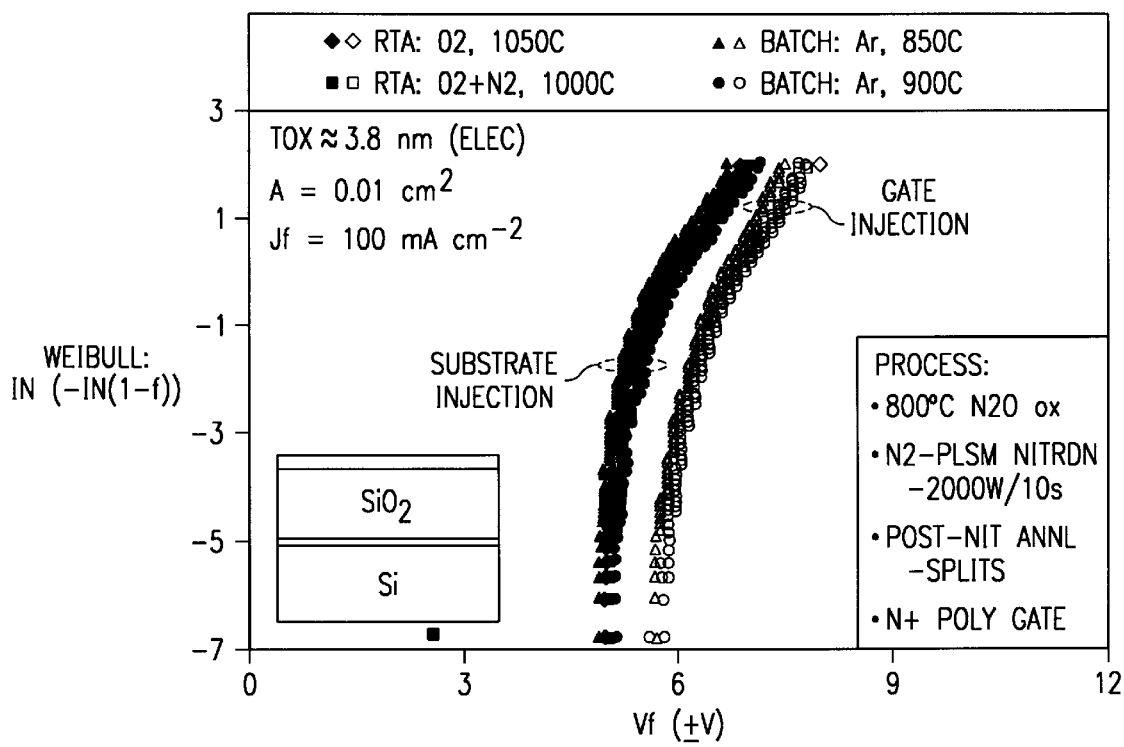
FIG. 5 is a graph of time-zero soft-breakdown measurements.
Figure 6:
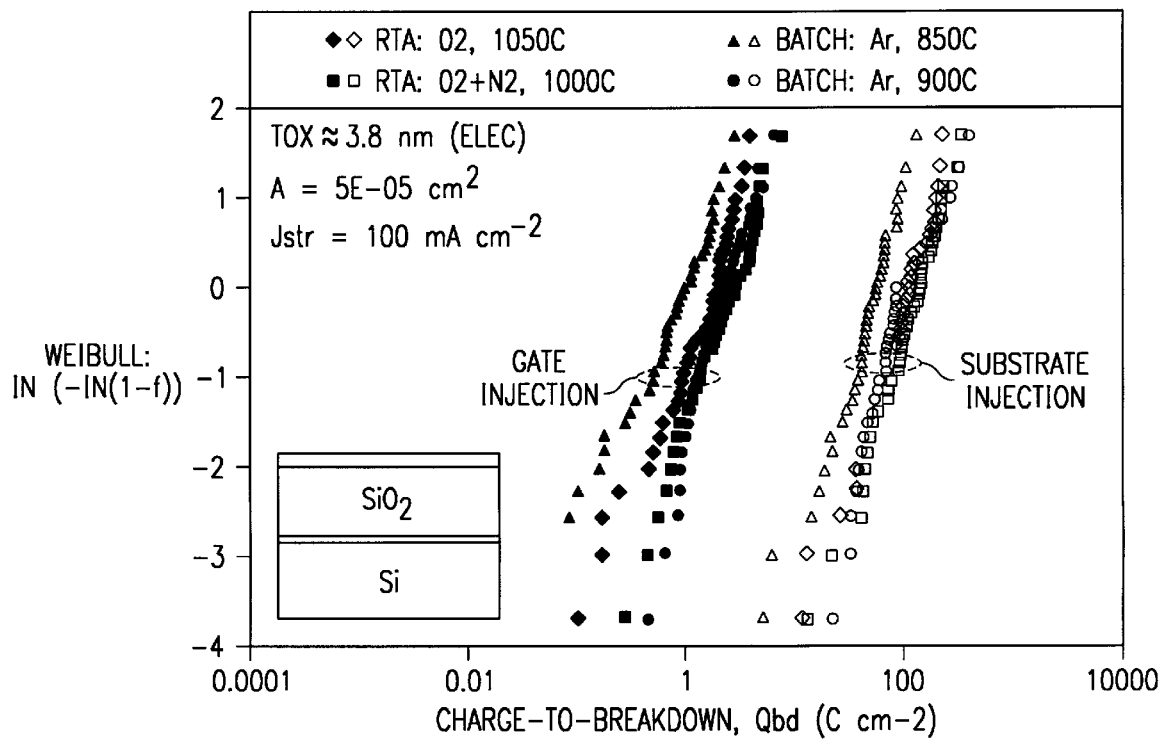
FIG. 6 is a graph of charge-to-breakdown measurements.

Plasma nitridation offers several advantages including excellent controllability, a low incidence of low-field breakdowns and no significant degradation of GOI. FIG. 4 shows the [N] and [O] concentration versus depth. The [N] profile has a sharp N signature confined near the oxide surface as a result of the $N_2$ plasma nitridation. A discernable [N] signature is also found at the bottom of the $SiO_2$/Si interface form a $N_2O$ oxidation step. FIG. 5 shows the time-zero soft breakdown measurements for a $N_2$-plasma nitrided $N_2O$-grown $SiO_2$ layer. Process conditions were as follows: a 800° C. $N_2O$ oxidation followed by a $N_2$-plasma nitridation using a plasma power of 2000W for 10 sec., followed by post nitridation anneal splits as indicated. In all, there was a low incidence of low-field breakdowns for substrate- and gate-injection. FIG. 6 shows the charge-to-breakdown measurements for the same process and anneal splits. No significant degradation in the oxide integrity was discovered.

While this invention has been described with reference to illustrative embodiments, this description is not intended to be construed in a limiting sense. Various modifications and combinations of the illustrative embodiments, as well as other embodiments of the invention, such as forming more than two different effective dielectric thicknesses, will be apparent to persons skilled in the art upon reference to the description. It is therefore intended that the appended claims encompass any such modifications or embodiments.

What is claimed is:

1. A method of forming a dielectric layer having at least two effective thicknesses, comprising the steps of:

forming a masking layer over a structure, said masking layer covering a first area of said structure;

subjecting said structure with said masking layer to a high density plasma nitridation having a plasma density in the range of $10^{10}$ to $10^{12}$ cm$^{-3}$;

removing said masking layer;

oxidizing said structure.

2. The method of claim 1, wherein said plasma nitridation uses a nitrogen containing precursor selected from the group consisting of $N_2$ or $NH_3$ or a mixture thereof with an inert gas or an oxidizing gas.

3. The method of claim 1, wherein said plasma nitridation occurs at a temperature in the range of 77K–773 K.

4. The method of claim 1, wherein said plasma nitridation occurs at a pressure in the range of 1 to 50 mTorr.

5. The method of claim 1, wherein said plasma nitridation comprises a nitrogen flow in the range of 1 to 100 sccm.

6. The method of claim 1, wherein said plasma nitridation comprises a duration in the range of 1 to 300 seconds.

7. The method of claim 1, wherein said plasma nitridation comprises a substrate bias in the range of 0 to 200 Volts.

8. A method of manufacturing a gate dielectric having at least two effective thicknesses, comprising the steps of:

forming a dielectric layer over a structure;

forming a masking layer over said dielectric, said masking layer exposing a portion of said dielectric layer;

subjecting said exposed portion of said dielectric layer to a high density nitrogen-containing plasma having a plasma density in the range of $10^{10}$ to $10^{12}$ cm$^{-3}$;

removing said masking layer.

9. The method of claim 8, wherein said subjecting step converts a surface of said portion of said dielectric layer to a nitride or oxynitride layer, thereby reducing the effective thickness of said gate dielectric.

10. The method of claim 8, wherein said nitrogen-containing plasma uses a nitrogen containing precursor selected from the group comprising $N_2$, $NH_3$, NO, $N_2O$, or a mixture thereof with or without an inert gas.

11. The method of claim 8, wherein said nitrogen-containing plasma occurs at a temperature in the range of 77 K–773 K.

12. The method of claim 1, wherein said nitrogen-containing plasma occurs at a pressure in the range of 1 to 50 mTorr.

13. The method of claim 8, wherein said nitrogen-containing plasma comprises a nitrogen flow in the range of 1 to 100 sccm.

14. The method of claim 8, wherein said nitrogen-containing plasma nitridation comprises a duration in the range of 1 to 300 seconds.

15. The method of claim 8, wherein said nitrogen-containing plasma comprises a substrate bias in the range of 0 to 200 Volts.

* * * * *